United States Patent [19]
Agarwala et al.

[11] Patent Number: 5,268,072
[45] Date of Patent: Dec. 7, 1993

[54] ETCHING PROCESSES FOR AVOIDING EDGE STRESS IN SEMICONDUCTOR CHIP SOLDER BUMPS

[75] Inventors: Birendra N. Agarwala, Hopewell Junction; Madhav Datta, Yorktown Heights; Richard E. Gegenwarth, Poughkeepsie; Christopher V. Jahnes, Monsey; Patrick M. Miller, Poughkeepsie, all of N.Y.; Henry A. Nye, III, Danbury; Jeffrey F. Roeder, Brookfield, both of Conn.; Michael A. Russak, Brewster, N.Y.

[73] Assignee: International Business Machines Corporation, Armonk, N.Y.

[21] Appl. No.: 938,074

[22] Filed: Aug. 31, 1992

[51] Int. Cl.$^5$ .................................. B44C 1/22
[52] U.S. Cl. ...................... 156/664; 156/634; 156/656; 156/666; 437/183; 437/192
[58] Field of Search .............. 437/183, 249, 192; 156/664, 633, 634, 666, 656

[56] References Cited
U.S. PATENT DOCUMENTS

| | | | |
|---|---|---|---|
| 4,427,715 | 1/1984 | Harris | 437/183 |
| 4,434,434 | 2/1984 | Bhattacharya et al. | 357/71 |
| 5,024,722 | 6/1991 | Cathey, Jr. | 156/664 |
| 5,057,453 | 10/1991 | Endo et al. | 437/183 |

OTHER PUBLICATIONS

T. Kawanobe, et al., "Solder Bump Fabrication by Electrochemical Method for Flip Chip Interconnection" IEEE, CH1671-7/81/0000-0149 1981, pp. 149-155.
M. Warrior, "Reliability Improvements in Solder Bump Processing for Flip Chips" IEEE 0569-5503/90/00-00-0460, 1990, pp. 460-469.

Primary Examiner—Brian E. Hearn
Assistant Examiner—Kevin M. Picardat
Attorney, Agent, or Firm—Harold Huberfeld

[57] ABSTRACT

Etching processes are disclosed for producing a graded or stepped edge profile in a contact pad formed between a chip passivating layer and a solder bump. The stepped edge profile reduces edge stress that tends to cause cracking in the underlying passivating layer. The pad comprises a bottom layer of chromium, a top layer of copper and an intermediate layer of phased chromium-copper. An intermetallic layer of CuSn forms if and when the solder is reflowed, in accordance with certain disclosed variations of the process. In all the variations, the solder is used as an etching mask in combination with several different etching techniques including electroetching, wet etching, anisotropic dry etching and ion beam etching.

14 Claims, 11 Drawing Sheets

ETCHING PROCESSES FOR AVOIDING EDGE STRESS IN SEMICONDUCTOR CHIP SOLDER BUMPS

BACKGROUND OF THE INVENTION

The present invention generally relates to processes for making electrical connections to semiconductor integrated circuit chips and, more specifically, to such processes of the controlled collapse chip connection (C4) type.

The use of C4 or solder bump terminals on semiconductor devices for face-down or "flip chip" bonding to a supporting dielectric substrate or module is well known in the art. U.S. Pat. No. 4,434,434 issued to Somnath Bhattacharya et al on Feb. 28, 1984 and other patents cited therein describe the C4 technique in detail. Briefly, in accordance with one approach, solder balls are connected via solder bump terminals and contact pads to semiconductor devices which normally are passivated with a brittle coating such as silicon dioxide. Each said terminal is located at a contact opening, extending through the passivating layer, previously coated with a solder bump contact pad. Each pad extends through the opening and connects with the underlying device circuitry. The contact pads comprise metallic laminates such as chromium, copper-chromium and copper.

As pointed out in the cited patent, the BLM technique has been used extensively but a tendency has been noted to exist, especially when an approximately 95% Pb-5% Sn solder composition is used for the solder ball, for the brittle passivating layer to crack about the perimeter of the solder ball. Stress appears to develop at the abrupt edge of the contact pad, causing the brittle passivating layer to crack around the solder ball. The cited patent further teaches that the foregoing tendency to crack can be reduced by delocalizing or spreading out the solder edge stresses imposed on the contact pad structure and the underlying brittle passivating layer.

The stresses are spread out by modifying the geometry of the laminated contact pad to incorporate a graded or stepped profile at the peripheral portion of the pad, i.e., a bottom chromium layer of greater lateral extent, a top copper layer of lesser lateral extent and an intermediate layer of an intermix of the copper and chromium. The differing lateral extents of the chrome and copper layers are achieved, in accordance with the cited patent, by using a rotating dome vacuum evaporator to deposit the layers while off-centering the chromium source during the respective evaporation cycles. No other method is disclosed, for producing the graded or stepped profile defined above.

SUMMARY OF THE INVENTION

One purpose of the present invention is to provide a method for producing a graded or stepped profile at the peripheral portion of solder bump terminals. Another purpose of the present invention is to provide a method for producing a graded or stepped profile at the peripheral portion of solder bump terminals without resort to metal evaporation techniques.

These and other purposes of the present invention, as will appear from a reading of the following specification, are achieved by plating a solder bump on a contact pad for connecting to a passivated semiconductor device. The contact pad comprises a bottom layer of metal for adhering to the remainder of the contact pad and to the device passivation material, a top layer of different metal wettable with solder, and a phased layer for adhering to the bottom layer and to the solder bump via an intermetallic layer, if any, which forms between the top layer and the solder mound if the solder is reflowed. In a typical example, the bottom layer is chromium (Cr), the top layer is copper (Cu), the phased layer is Cr-Cu and the intermetallic layer is $Cu_3Sn$.

The solder bump is preferably plated, rather than evaporated or sputtered through a physical mask to provide a cost effective process for large diameter wafer (>200 mm) technologies where the cost for long throw evaporators becomes very significant.

In a first species of the present invention, the solder is used as a mask, the Cu layer, the Cr-Cu phased layer and the Cr layer are removed by electroetching, the Cu layer is etched back by wet etching to yield a stepped profile. The solder then is reflowed to provide the intermetallic.

In a second species, the Cu and Cr-Cu layers are electroetched as before, the solder is reflowed and the Cr layer is removed by a highly directional dry etch, using the reflowed solder as a mask.

In a third species, the solder is deposited and overplated in a mushroom-like configuration and the Cu and Cr-Cu layers again are electroetched as before. The Cr layer is removed by a highly directional dry etch and then the solder is reflowed.

In a fourth species, ion beam milling-type processes are used to dry etch all of the Cu, Cr-Cu and Cr layers using the solder bump as a mask in various combinations with and without the reflowing of the solder mound and with normal incidence of the ion etching beam relative to a stationary solder bump device or with off-normal incidence of the ion etching beam relative to a rotating solder bump device.

BEST MODE FOR CARRYING OUT THE INVENTION

The fourth embodiment of the present invention, as defined above in connection with FIGS. 4, 5A, 5B, 6, 7A and 7B advantageously is simpler than the other three embodiments in that a single process type (ion-beam milling) is used to remove all unwanted material. The other three embodiments are useful and viable alternatives in their own right and will be described first.

Figure 1A:
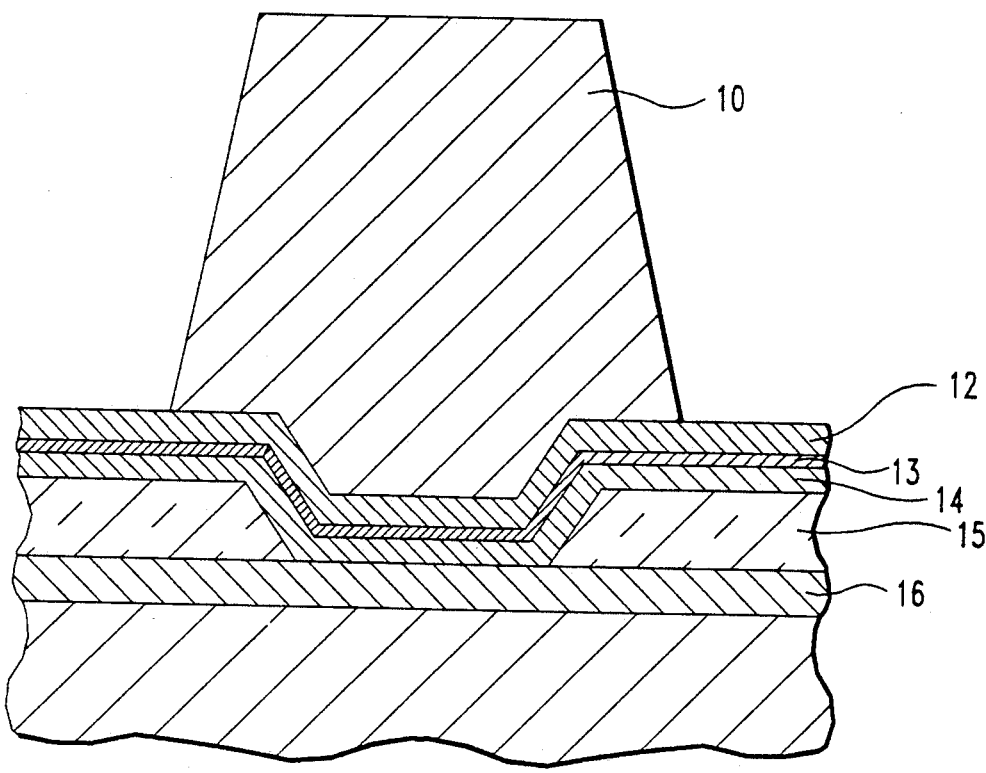
FIGS. 1A-1E are simplified cross-sectional views of a solder bump and a solder bump contact pad as they appear at successive times in accordance with the process of a first embodiment of the present invention.

Referring to FIG. 1A, a solder bump 10 is plated and formed on top of evaporated or sputter deposited contact pad layers 12, 13 and 14 mounted on passivating layer 15. The contact pad passes through an opening in the layer 15 to make electrical contact with a conductor 16, forming part of a wiring pattern in a known manner. Layer 12 typically is Cu, layer 14 typically is Cr and layer 13 is the phased material Cr-Cu resulting from the simultaneous deposition of Cu and Cr. Layer 15 is a passivating layer, e.g. $SiO_2$, $Si_3N_4$, polyimide, etc. In order to produce the formed contact pad or controlled collapse chip connection (C4), layers 12, 13 and 14 are etched off, using solder bump 10 as a mask, in accordance with the present invention, stress-related cracking of the passivating layer 15 about the perimeter of the C4 is avoided by providing a stepped profile at the peripheral portion of the contact pad in a manner now to be described.

Figure 1B:
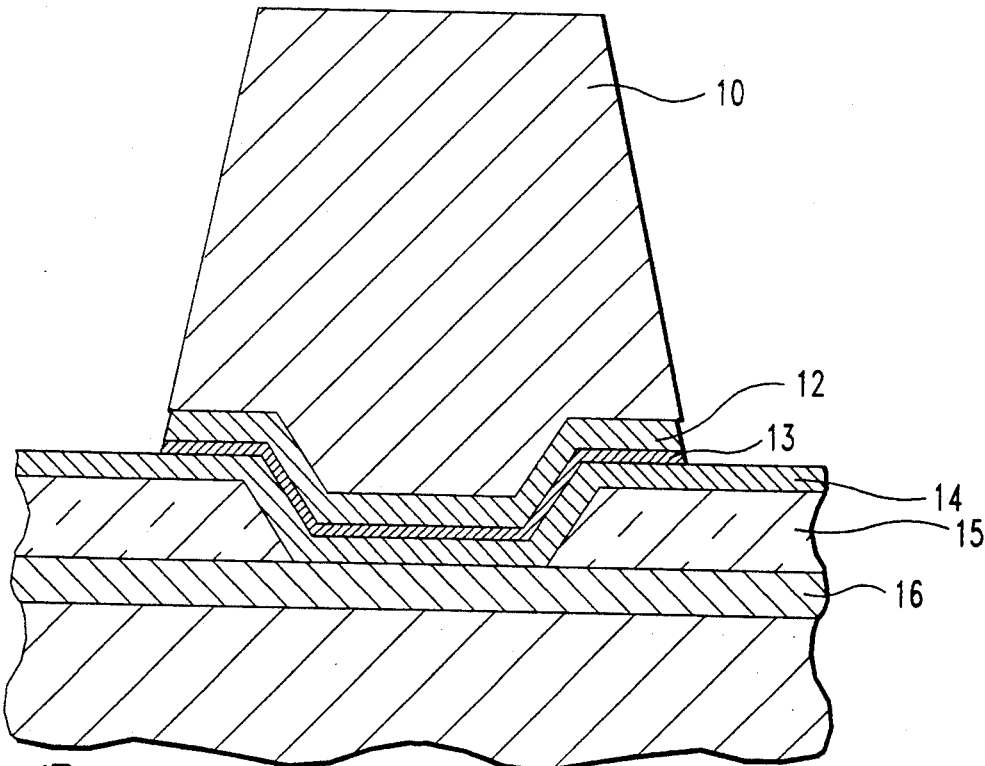
Figure 1C:
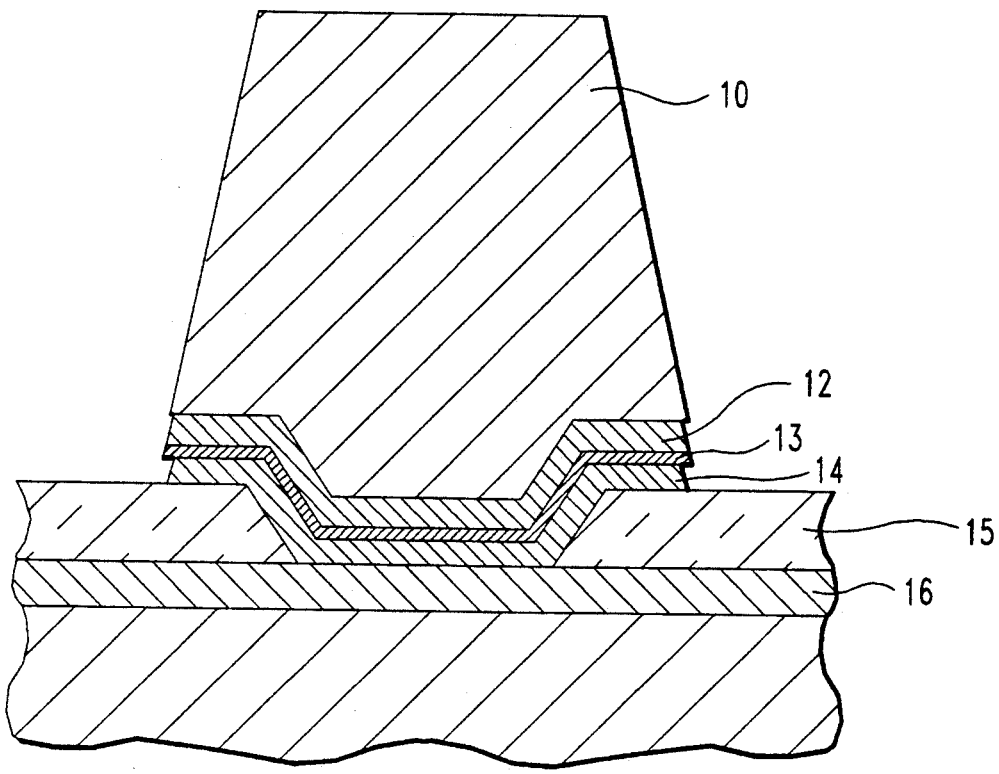
Figure 1D:
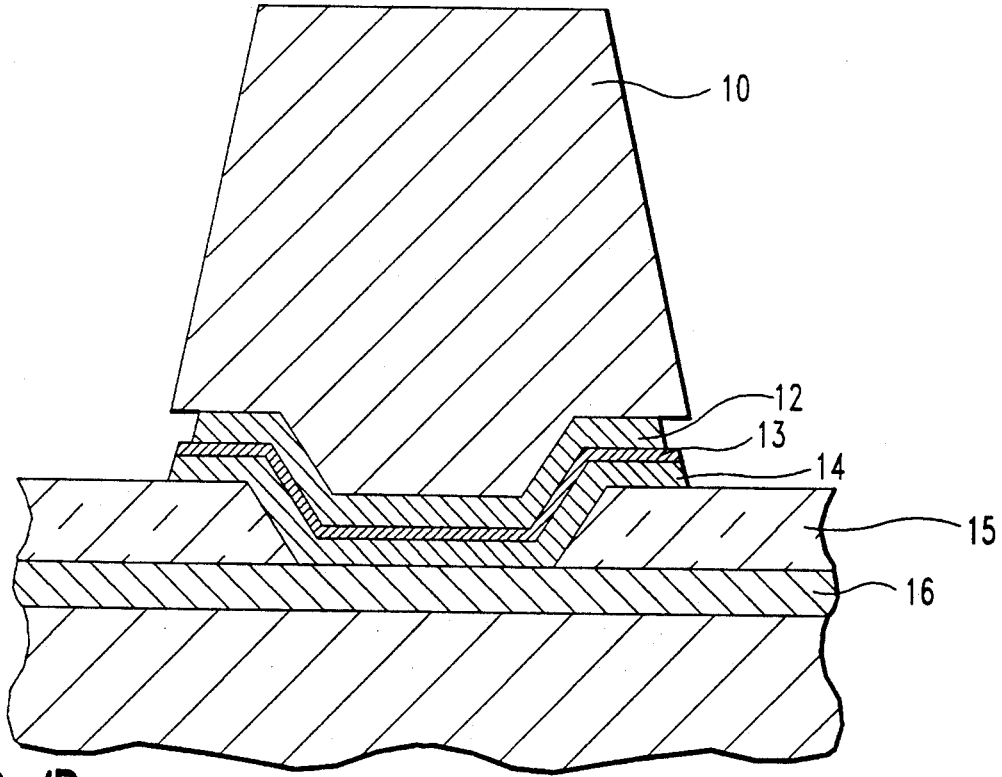
Figure 1E:
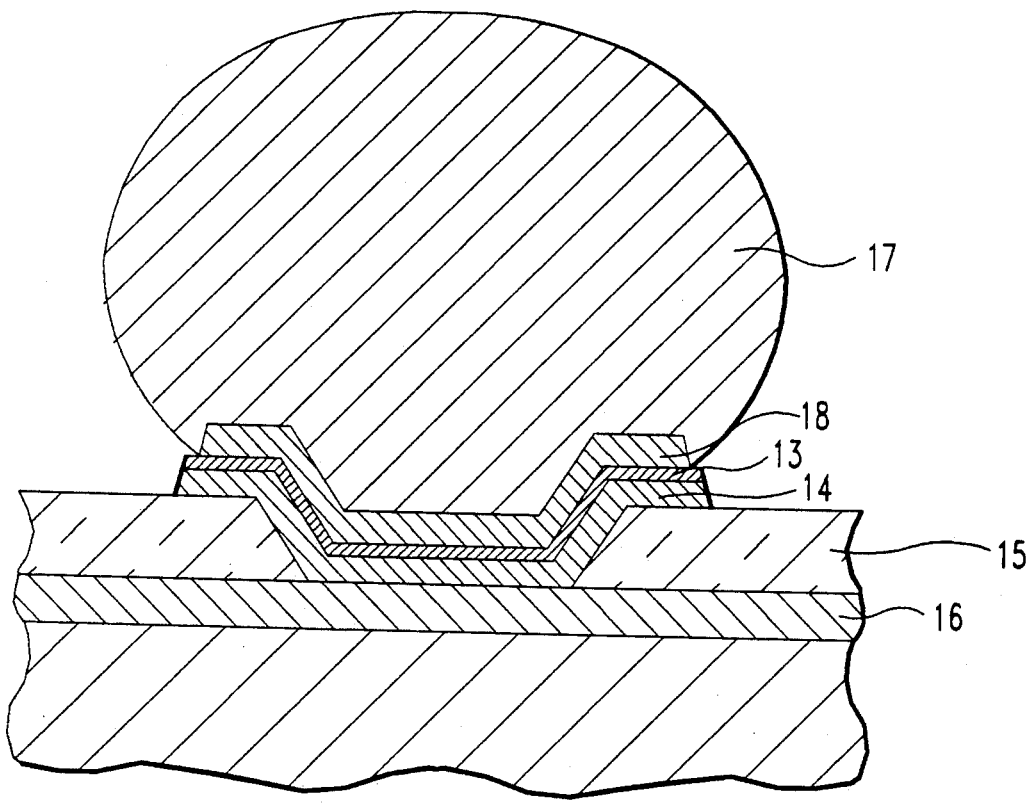

Cu layer 12 and phased Cr-Cu layer 13 are removed, using solder 10 as a mask, by electroetching in a potassium sulfate solution (FIG. 1B). Then, the Cr layer 14 is chemically etched in a potassium permanganate solution. The result is the nearly coincident vertical edge shown in FIG. 1C. A wet etch, for example $H_2SO_4$/$CrO_3$, is used next to attack the Cu layer preferentially and yield the non-coincident vertical edge depicted in FIG. 1D. Finally, the solder is reflowed to produce the solder ball 17 and the CuSn intermetallic layer 18 of FIG. 1E.

Figure 2A:
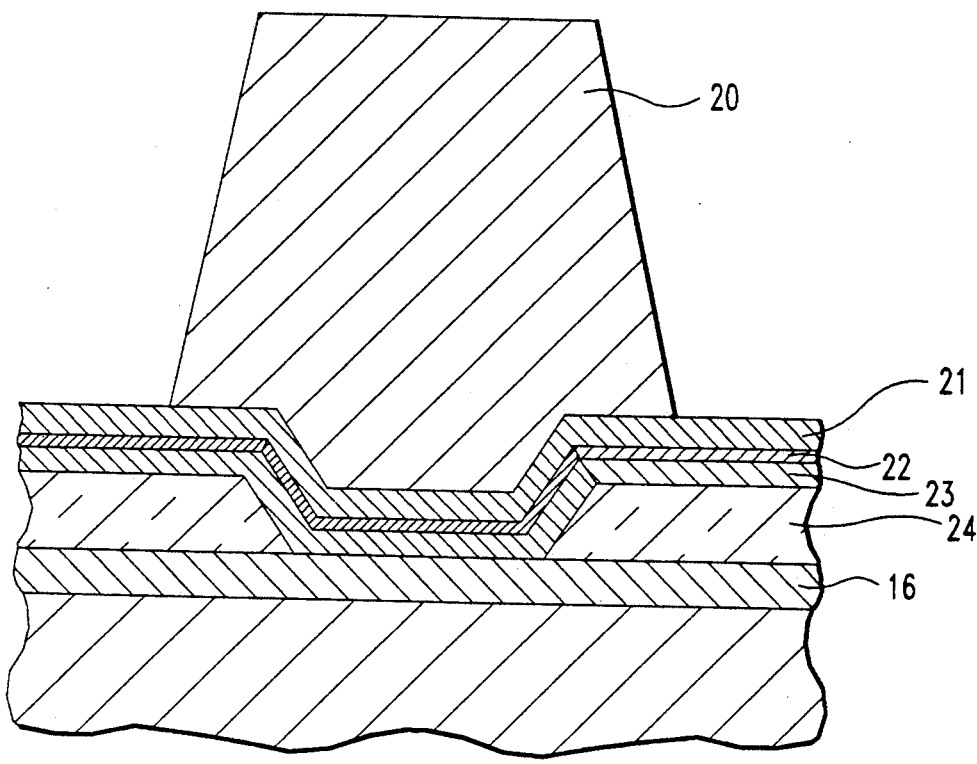
FIGS. 2A-2D are views like those of FIGS. 1A-1E but in accordance with the process of a second embodiment of the present invention.
Figure 2B:
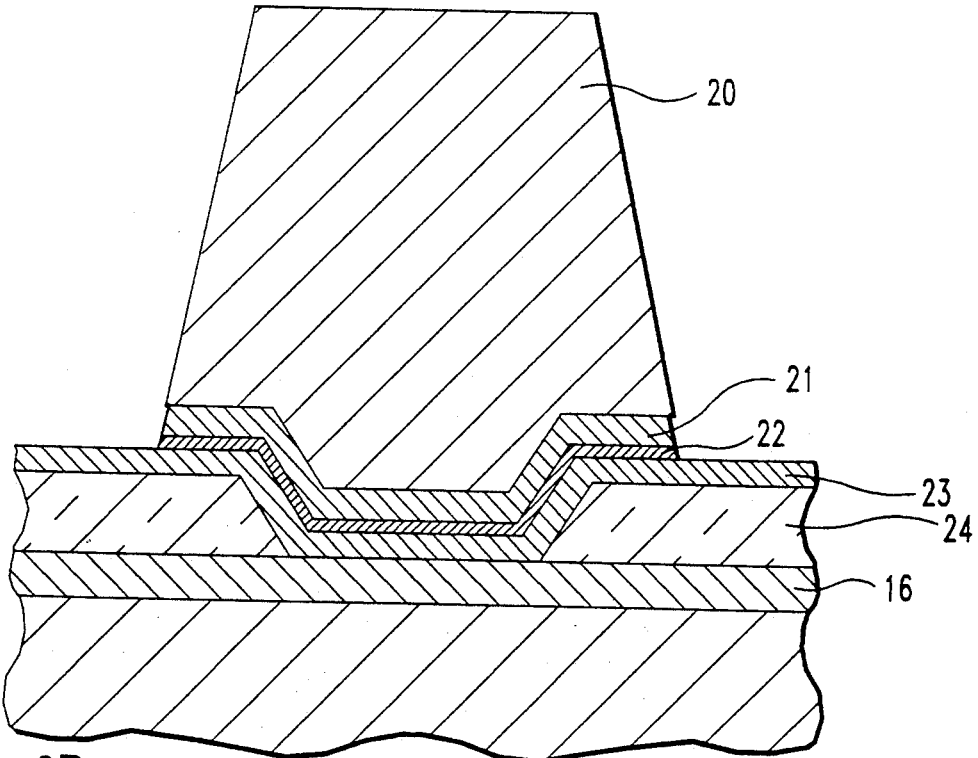
Figure 2C:
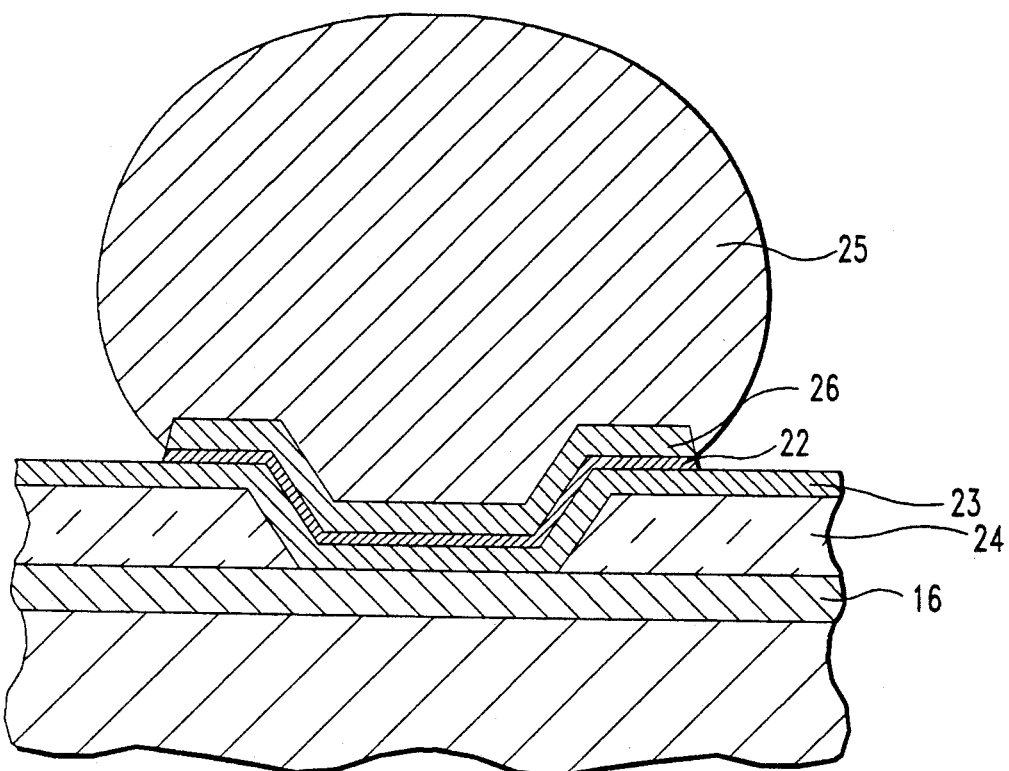

A second embodiment of the present invention follows the same electroetching techniques just described for the removal of the Cu and phased Cr-Cu layers 21 and 22, respectively, (FIGS. 2A and 2B). The solder 20 is reflowed at this point, however, to provide solder ball 25 and the CuSn intermetallic layer 26 of FIG. 2C. Lastly, the C4 is completed by use of a highly directional dry etch (e.g., $CF_4+O_2$ or $SF_6+O_2$) employing the solder ball as a mask to provide the tapered, non-coincident contour 27 about the perimeter of the C4.

Figure 2D:
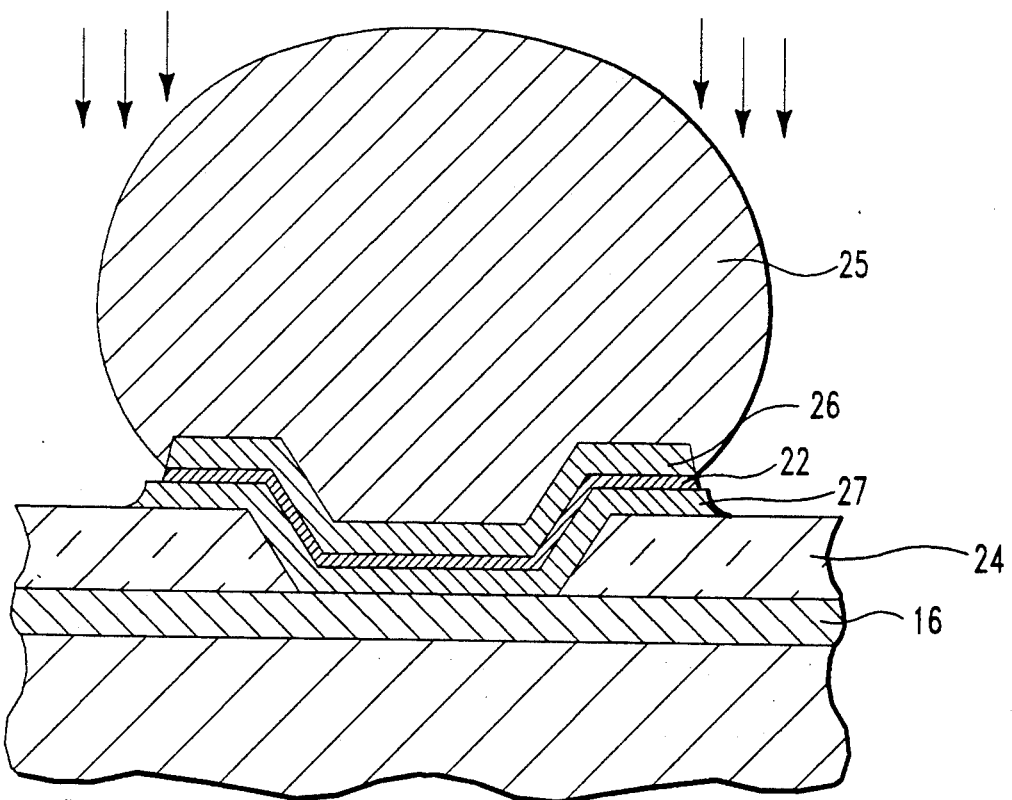
Figure 3A:
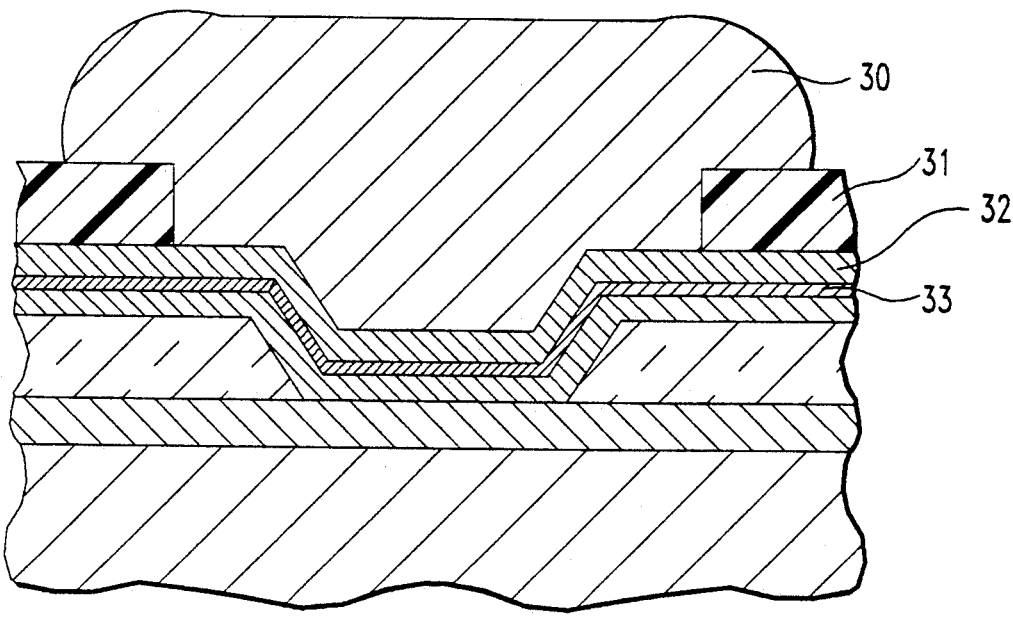
FIGS. 3A-3D are views like those of FIGS. 1A-1E but in accordance with the process of a third embodiment of the invention.
Figure 3B:
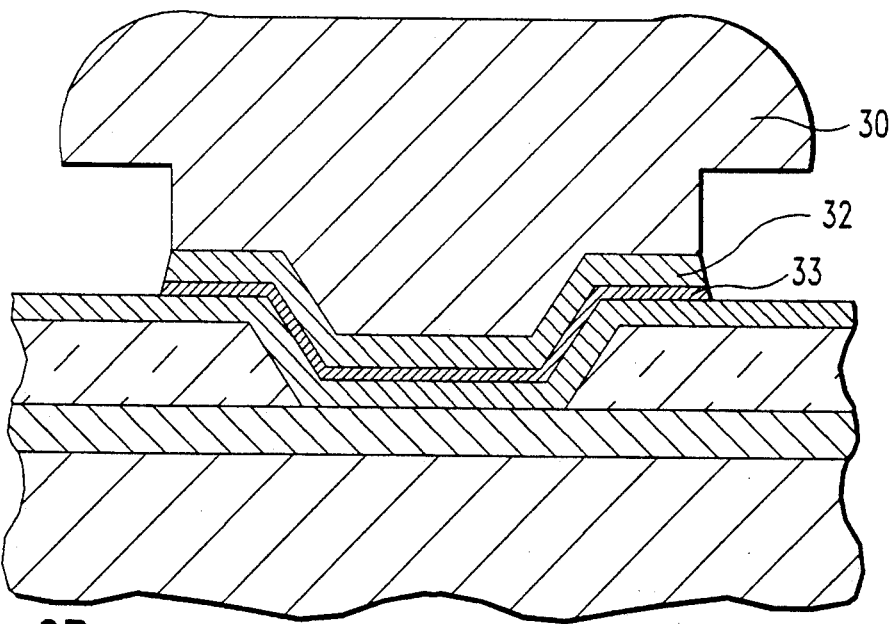
Figure 3C:
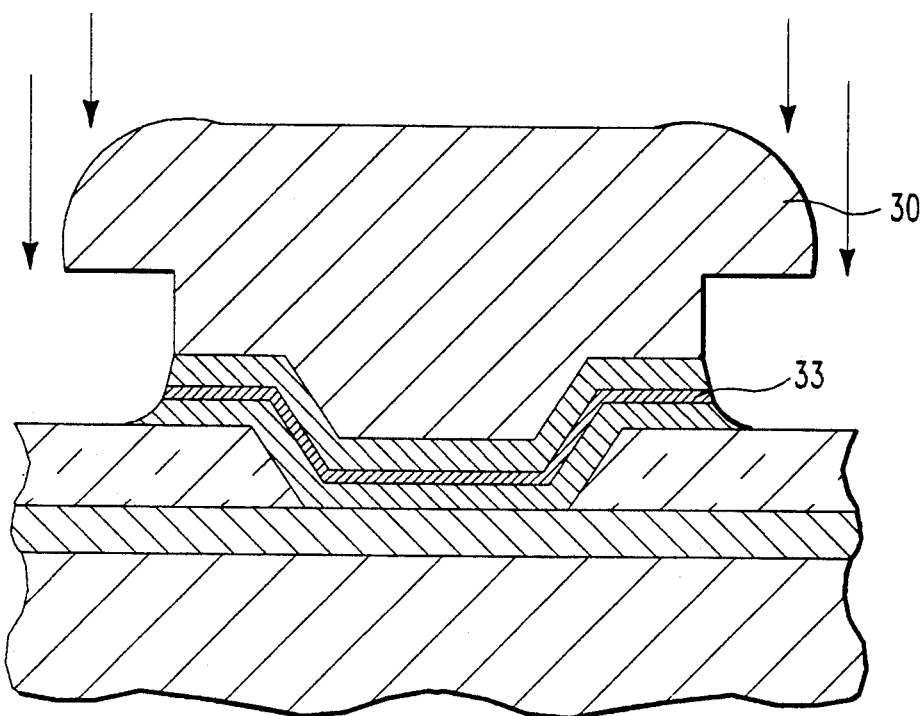
Figure 3D:
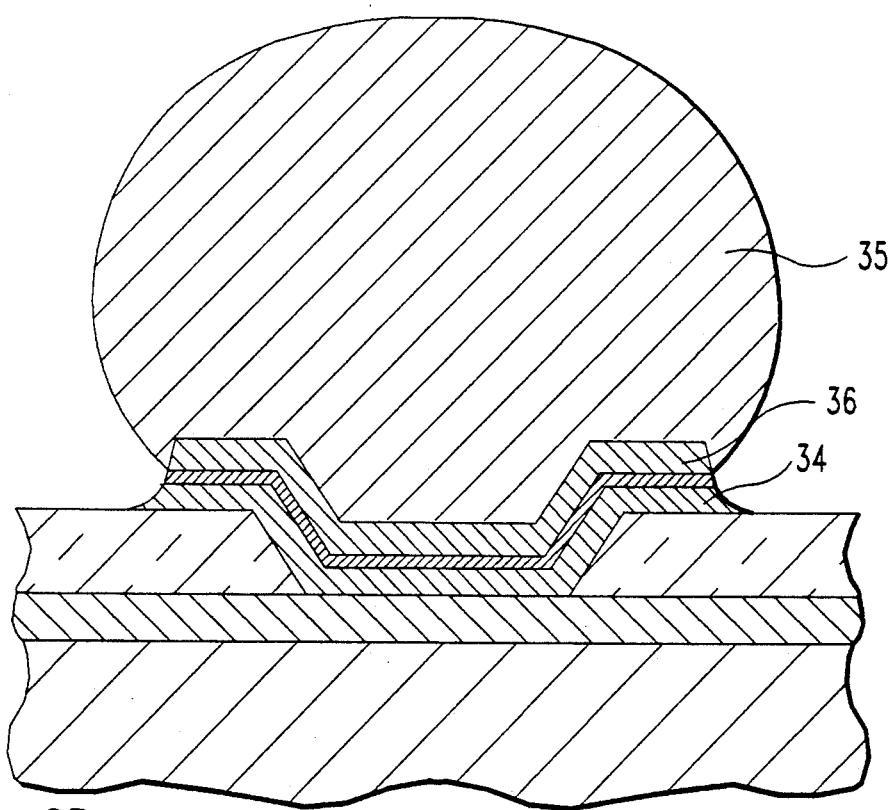

A third species of the invention provides for the use of a dry etching process, as in FIG. 2D, without first reflowing the solder to act as a dry etching mask. In this variation, the solder 30 is overplated on resist 31 of FIG. 3A so as to assume a mushroom-like shape having a peripheral overhanging ledge when resist 31 is removed. Electroetching Cu layer 32 and phased Cr-Cu layer 33 yields the structure shown in FIG. 3B. The application of highly directional dry etching to the unreflowed, but overhanging solder structure 30 produces the flaired, sloping contour of Cr layer 34 depicted in FIG. 3C. The C4 structure is completed by reflowing the solder 30 into solder ball 35 and converting Cu layer 32 into CuSn intermetallic layer 36.

Figure 4:
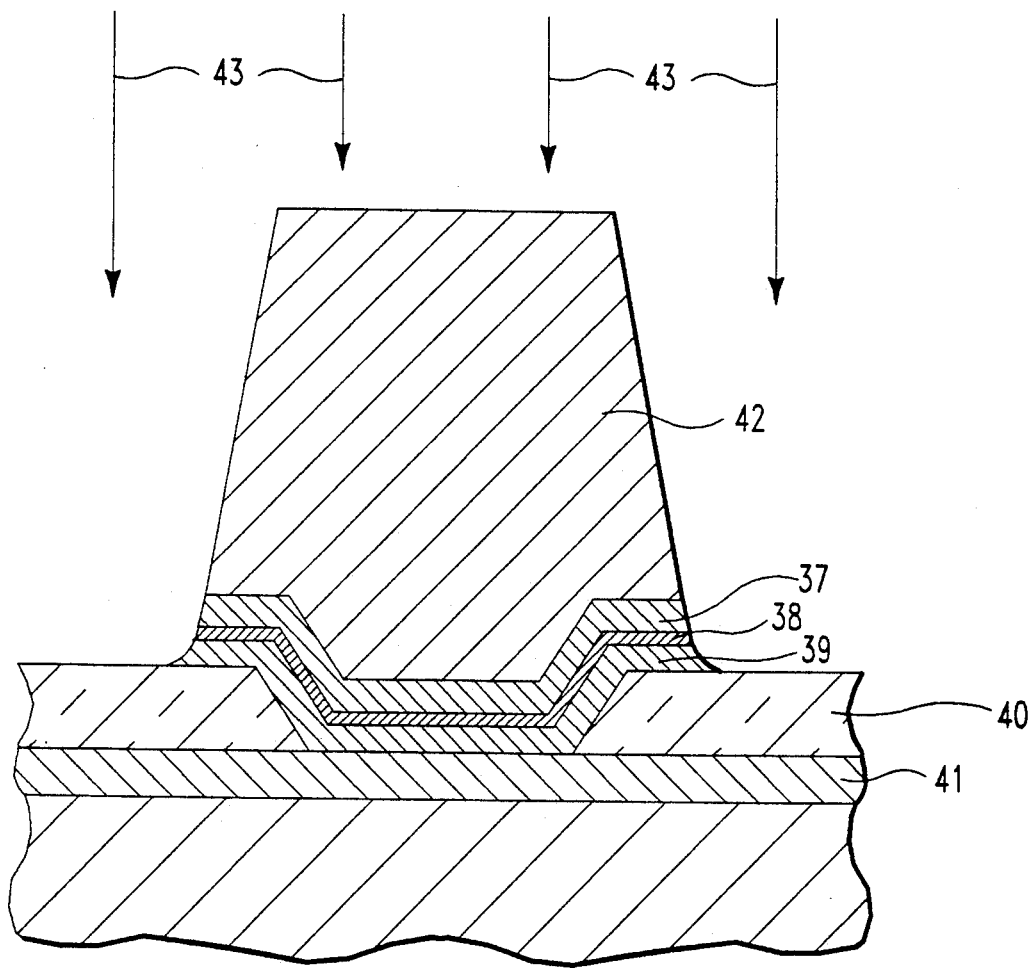
FIGS. 4, 5A, 5B, 6, 7A and 7B are cross-sectional views of a solder mound and a solder mound contact pad as they appear when processed in accordance with four different variations of a fourth embodiment of the present invention using solely ion-beam milling-type processing.

A fourth species of the present invention differs from all the others in that a single etching process, e.g., ion beam milling, is used in the removal of all excess contact pad material while still imparting a proper peripheral profile thereto to avoid undesirable cracking of the passivating layer as previously explained. Referring to FIG. 4, PbSn solder 42, Cu layer 37, Cr-Cu phased layer 38 and Cr layer 39 are produced, as before, on passivating layer 40. Ion beam milling (or etching) IBE is directed at the structure at normal incidence to pattern the C4 as shown with a feathered profile being imparted to the perimeter of layers 37, 38 and 39. The solder 42 acts as a physical mask whereby the C4 pattern after milling is slightly larger than the solder pad 42 itself. The feathered or flaired profile reduces stress concentrations at the edges of the successive layers 37, 38 and 39.

Figure 5A:
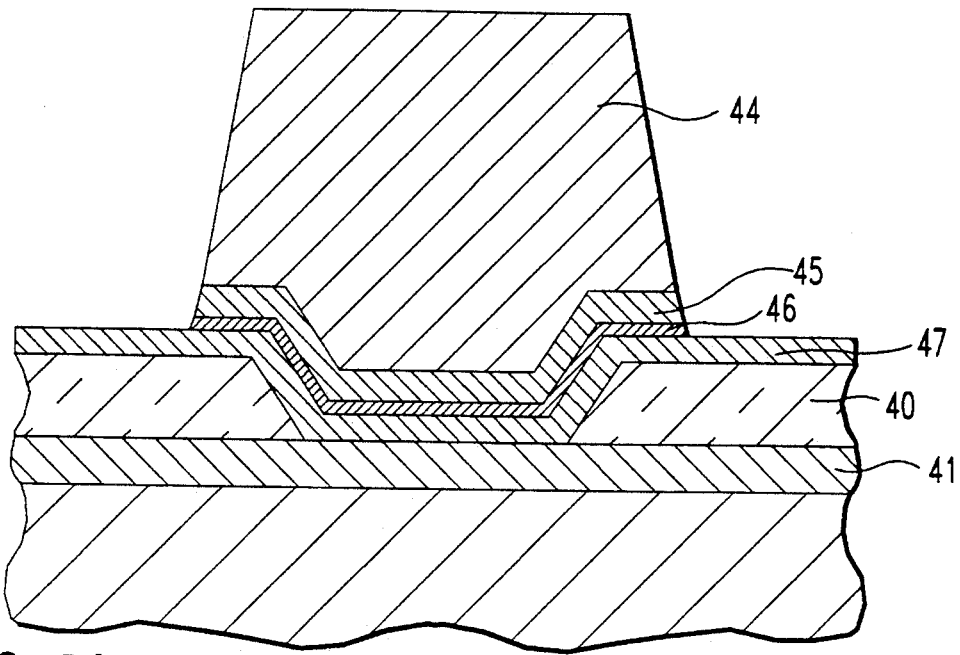

In the process variation represented in FIG. 5A, Cu layer 45 and CrCu layer 46 are ion milled and patterned as in the case of FIG. 4 but PbSn solder 44 is reflowed (FIG. 5B) before Cr layer 47 is ion milled. That is, reflowed PbSn solder 48 is used as a mask when the IBE is reapplied at normal incidence. The conversion of the PbSn alloy from a cylindrical shape (FIG. 5A) to a reflowed spherical shape (FIG. 5B) with much larger diameter causes the transfer of a wider IBE image to the Cr layer 47 and results in an oversized Cr pad with desirably reduced stress at the edge which joins layers 46 and 47.

Figure 6:
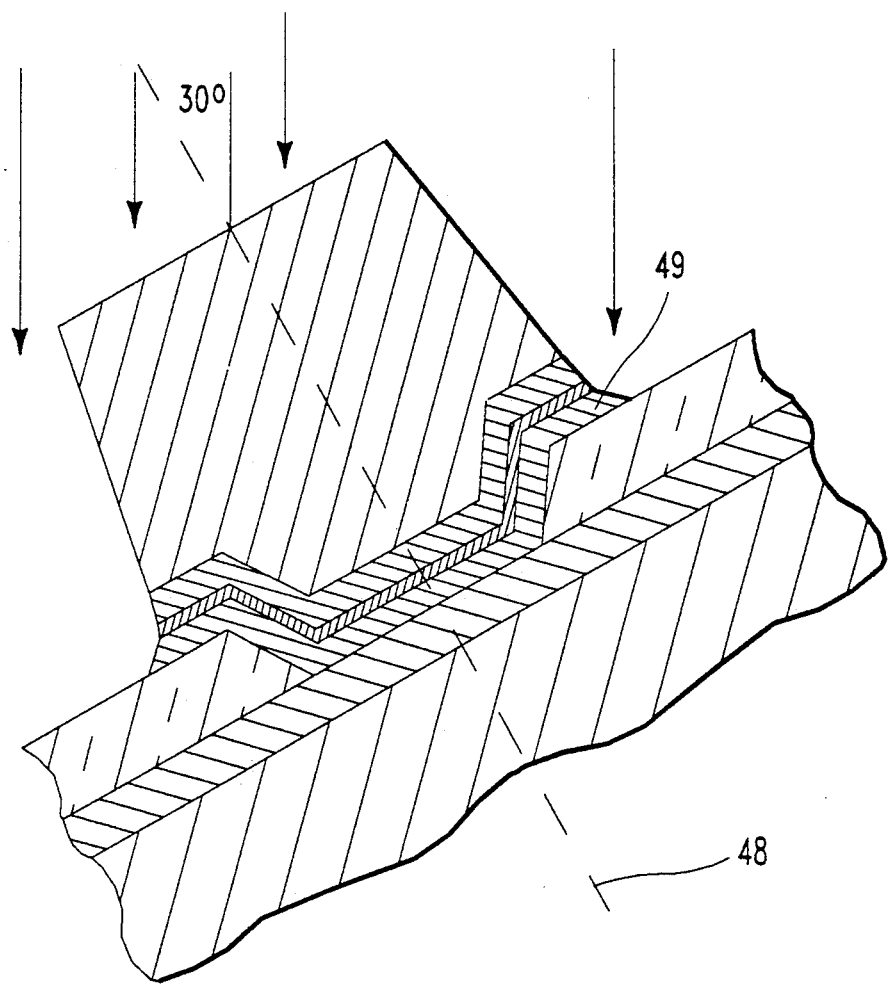

FIG. 6 is similar to FIG. 4 in that all etching of the layers is accomplished in one etching step but differs from FIG. 4 in that a flaired profile of greater extent is produced by the etching technique employed in FIG. 4. Specifically, the entire device structure of FIG. 4 is mounted for rotation about an axis 48 inclined (e.g., 30°) relative to the direction of IBE. The angle of inclination may be varied as needed to removed any resputtered residue of contact pad material. Inasmuch as the solder bump is relatively tall it casts a large masking area as it is rotated. The size of the Cr pad 49 (and the corresponding stress distribution) is determined by the incident IBE angle.

Figure 5B:
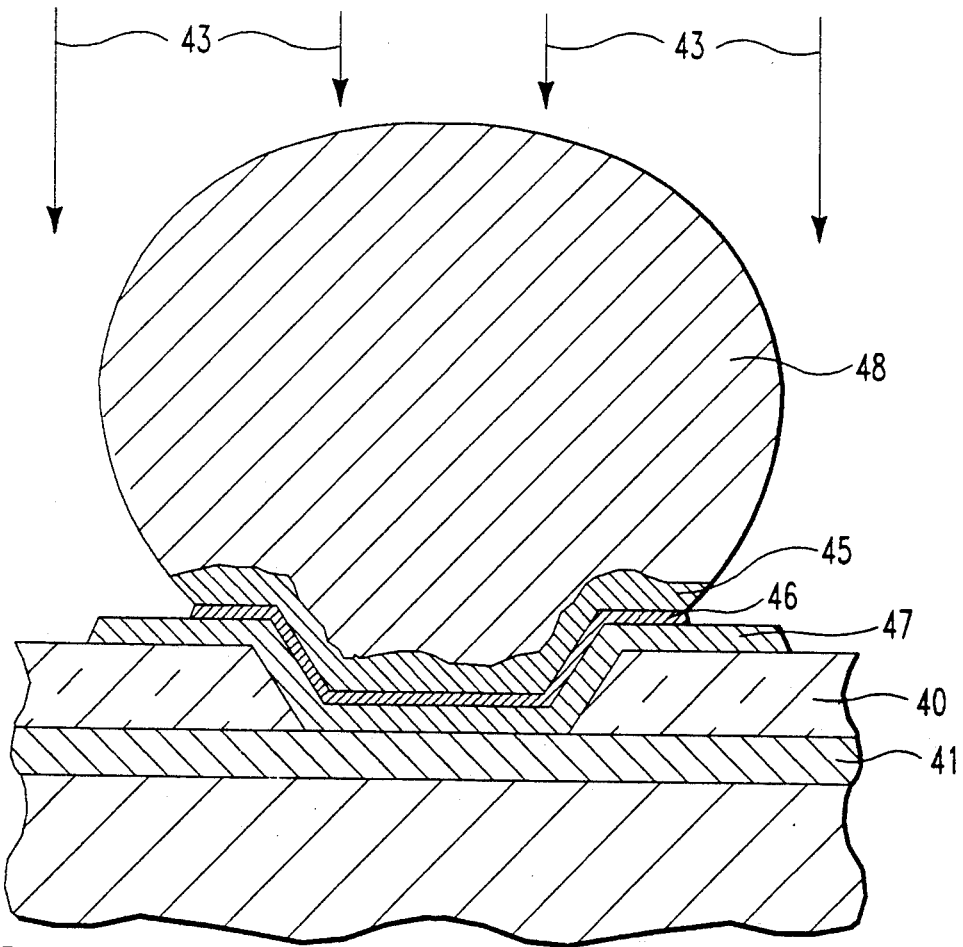
Figure 7A:
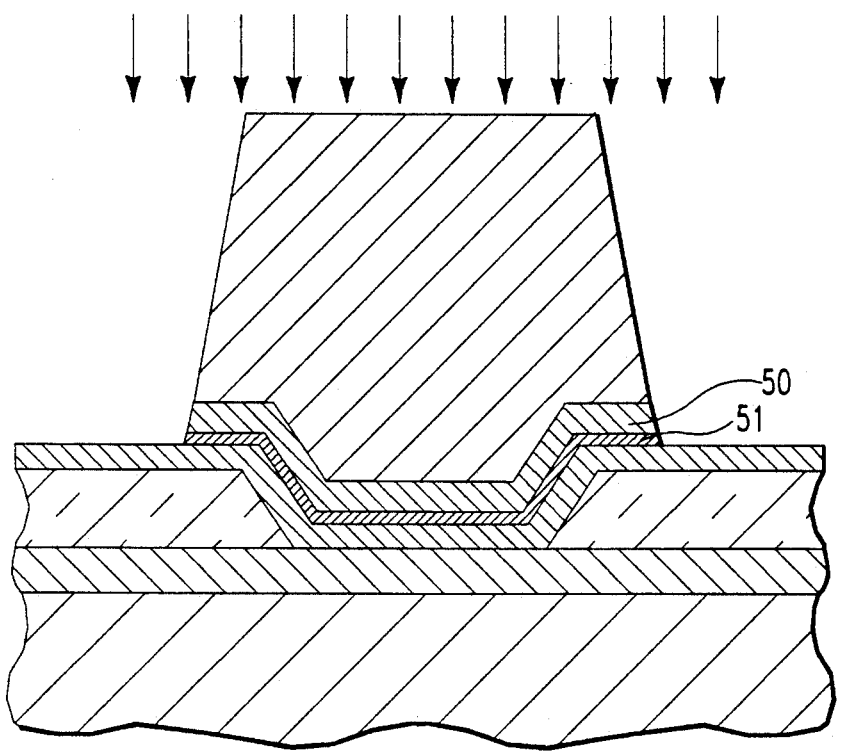
Figure 7B:
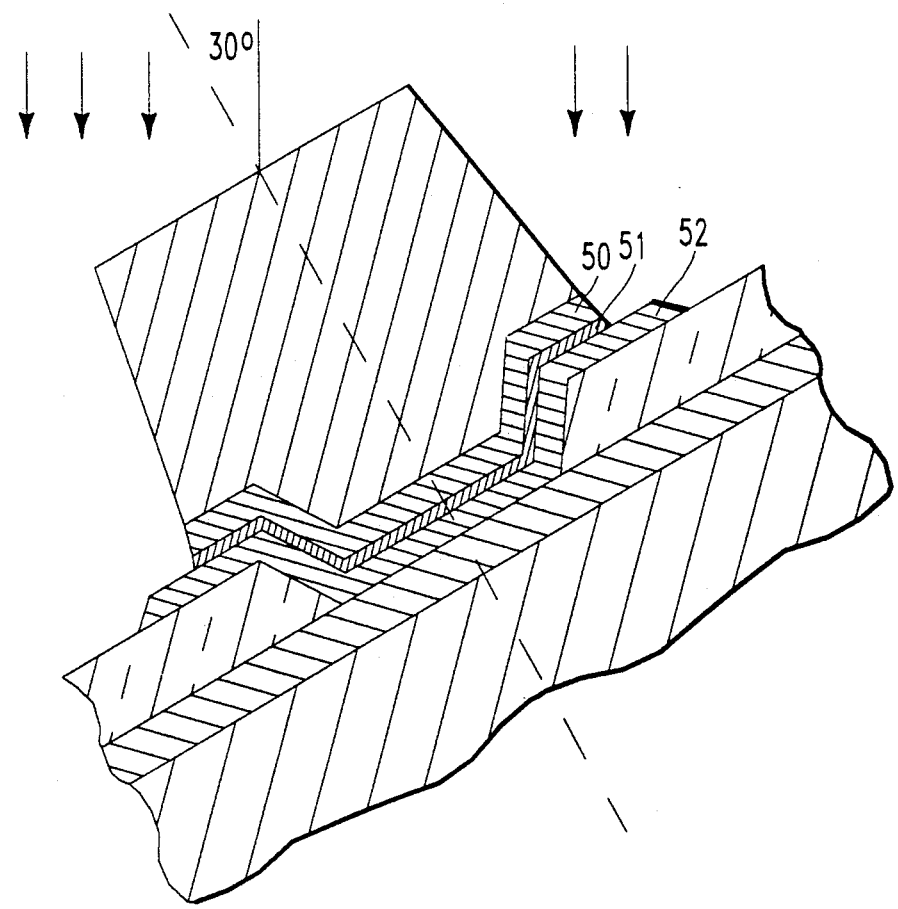

FIGS. 7A and 7B are broadly similar to FIGS. 5A and 5B in that the IBE is briefly interrupted during the milling sequence. FIG. 7A shows normally incident IBE for removing Cu layer 50 and CrCu layer 51, as in the case of FIG. 5A. In FIG. 7B, however, the entire device structure is mounted for rotation about an axis inclined relative to the IBE direction to impart a larger size to the final Cr pad 52 than would result if normal incidence IBE were used instead.

Although IBE has been described for removing unwanted portions of the Cu, CrCu and Cr layers, it should be noted that similar processes such as sputter etching and reactive ion etching also are suitable for ball limiting metallurgy removal. In addition, the basic C4 layers are not restricted to Cu and Cr. Other layer materials suitable for use with the present invention include, for example, Ti, Ta, Cr as the adhesion layer, Cu, Co, Ni as the solderable layer.

While there have been described what are at present considered to be the preferred embodiments of the present invention, it will be obvious to those skilled in the art that various changes or modifications may be made therein, without departing from the invention, and it is, therefore, aimed in the appended claims to cover all those changes and modifications as follow in the true spirit and scope of the invention.

What is claimed is:

1. An etching process for producing a graded edge profile in a contact pad comprising:
   providing a substrate,
   forming a passivating layer on said substrate,
   adhering a first metal layer to said passivating layer,
   forming a second metal layer on said first metal layer,
   forming a solder bump on said second metal layer thereby wetting said second metal layer with said solder to adhere said first and second layers to said solder, and
   etching said graded edge profile in said first and second metal layers using said solder bump as a mask, by removing a greater lateral extent of said second metal layer than said first metal layer.

2. The etching process defined in claim 1 wherein said solder is reflowed after said etching process is started but before said etching process is completed.

3. The etching process defined in claim 1 wherein said solder is reflowed after said etching process is completed.

4. The etching process defined in claim 1 wherein said etching process uses different etching techniques at different times.

5. The etching process defined in claim 1 wherein said etching process uses the same etching technique at all times.

6. The etching process defined in claim 5 wherein said etching technique is ion beam etching.

7. The etching process defined in claim 6 wherein said solder bump and contact pad are rotated about an axis inclined relative to the direction of the ion beam used in said ion beam etching.

8. The etching process defined in claim 1 wherein said first layer is chromium and said second layer is copper.

9. The etching process defined in claim 2 wherein said reflowed solder is used as a mask etch material for said first layer.

10. The etching process defined in claim 4 wherein said solder bump is mushroom-shaped.

11. The etching process defined in claim 1 wherein said solder bump is deposited by plating.

12. The etching process defined in claim 1 wherein said solder bump is deposited by evaporation.

13. The etching process defined in claim 11 wherein said first and second layers are sputter deposited.

14. The etching process defined in claim 11 wherein said first and second layers are deposited by evaporation.

* * * * *